United States Patent
Qu et al.

(10) Patent No.: US 9,882,174 B2
(45) Date of Patent: Jan. 30, 2018

(54) REPAIRING METHOD, REPAIRING DEVICE AND MANUFACTURING METHOD OF ARRAY SUBSTRATE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Yi Qu, Beijing (CN); Jun Wang, Beijing (CN); Jie Liu, Beijing (CN); Jiamian Sun, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/159,218

(22) Filed: May 19, 2016

(65) Prior Publication Data

US 2017/0047557 A1 Feb. 16, 2017

(30) Foreign Application Priority Data

Aug. 14, 2015 (CN) .......................... 2015 1 0502188

(51) Int. Cl.
*G09G 3/36* (2006.01)
*G09G 5/02* (2006.01)
(Continued)

(52) U.S. Cl.
CPC .......... *H01L 51/56* (2013.01); *H01L 27/3246* (2013.01); *H01L 27/3248* (2013.01); *H01L 2227/323* (2013.01); *H01L 2251/568* (2013.01)

(58) Field of Classification Search
CPC ............... H01L 27/1248; H01L 27/124; H01L 27/1214; H01L 27/1288; G02F 1/136259
(Continued)

(56) References Cited

U.S. PATENT DOCUMENTS

2004/0125332 A1* 7/2004 Choi ................ G02F 1/136259
349/190
2006/0077324 A1* 4/2006 Ahn .................. G02F 1/134363
349/114
(Continued)

FOREIGN PATENT DOCUMENTS

CN 1971939 A 5/2007

OTHER PUBLICATIONS

First Office Action dated Aug. 22, 2017 corresponding to Chinese application No. 201510502188.4.

*Primary Examiner* — Kimberly Rizkallah
*Assistant Examiner* — Brian Turner
(74) *Attorney, Agent, or Firm* — Nath, Goldberg & Meyer; Joshua B. Goldberg; Annie Kock

(57) ABSTRACT

The present invention provides a repairing method, a repairing device and a manufacturing method of an array substrate, the repairing method comprises: cutting off electrical connection between the pixel driving circuit and the first electrode in an abnormal pixel unit; forming a first through hole and a second through hole in a pixel defining layer according to positions of a selected candidate pixel unit and the abnormal pixel unit; forming a conductive connection part on the pixel defining layer, the conductive connection part electrically connects to the first electrode in the abnormal pixel unit through the first through hole, and to the first electrode in the candidate pixel unit through the second through hole. In the solutions in the present invention, the pixel driving circuit in the candidate pixel unit is electrically (Continued)

connected to the OLED in the abnormal pixel unit, so that the abnormal pixel unit is repaired.

20 Claims, 4 Drawing Sheets

(51) Int. Cl.
*G02F 1/1343* (2006.01)
*G09G 3/32* (2016.01)
*H01L 51/56* (2006.01)
*H01L 27/32* (2006.01)

(58) Field of Classification Search
USPC .......................... 257/40, 59, 72; 345/214, 92
See application file for complete search history.

(56) References Cited

U.S. PATENT DOCUMENTS

| | | | |
|---|---|---|---|
| 2006/0131751 A1* | 6/2006 | Minamihaba | H01L 21/76823 257/758 |
| 2006/0226865 A1* | 10/2006 | Gallarda | G02F 1/1309 349/192 |
| 2006/0290858 A1* | 12/2006 | Lai | G02F 1/136259 349/139 |
| 2007/0126460 A1* | 6/2007 | Chung | G09G 3/3648 345/98 |
| 2008/0001869 A1* | 1/2008 | Chung | G09G 3/3648 345/87 |
| 2013/0240914 A1 | 9/2013 | Jin et al. | |
| 2014/0111504 A1* | 4/2014 | Lee | G09G 3/3607 345/214 |

\* cited by examiner

REPAIRING METHOD, REPAIRING DEVICE AND MANUFACTURING METHOD OF ARRAY SUBSTRATE

FIELD OF THE INVENTION

The present invention relates to the field of display technology, and particularly to a repairing method of an array substrate, a repairing device of an array substrate and a manufacturing method of an array substrate.

BACKGROUND OF THE INVENTION

Active Matrix Organic Light Emitting Diodes (AMO-LEDs) have been widely applied more and more. Pixel display device of the AMOLED is an organic light-emitting diode (OLED).

OLED is a current driving light-emitting device. Specifically, a pixel driving circuit (including at least one driving transistor) is provided for each OLED, the pixel driving circuit is connected to an anode of the OLED and used to output a corresponding driving current to the OLED according to a data voltage, and the driving current drives the OLED to emit light.

When manufacturing the above pixel driving circuits on a base substrate, pixel driving circuits in part of pixel units may have defect, for example, material remain phenomenon, connection open phenomenon and the like, therefore the driving current transmitted to the OLED is not accurate, and thus there are point defect on the AMOLED display device.

At present, since the pixel driving circuit in each of the pixel units on the AMOLED display substrate has a complicated structure, the laser repairing technique for repairing the point defect used during repairing the liquid crystal display panel cannot be applicable to repair the pixel driving circuit in an abnormal pixel unit on the AMOLED display substrate.

It can be seen that, how to expediently repair the abnormal pixel unit causing the point defect on the AMOLED display device has become a problem urgently to be solved by persons skilled in the art.

SUMMARY OF THE INVENTION

The present invention provides a repairing method, a repairing device and a manufacturing method of an array substrate, which can effectively repair the abnormal pixel unit causing the point defect on the AMOLED display device.

To realize the above object, the present invention provides a repairing method of an array substrate, the array substrate comprises a plurality of pixel units, wherein each pixel unit is provided therein with a pixel driving circuit and a first electrode, a pixel defining layer is formed above the pixel driving circuit and the first electrode, and the pixel defining layer is provided with an opening communicating to the first electrode, wherein the repairing method comprises:

cutting off electrical connection between the pixel driving circuit and the first electrode in an abnormal pixel unit so as to disconnect the pixel driving circuit from the first electrode;

selecting, as a candidate pixel unit, a normal pixel unit adjacent to the abnormal pixel unit and emits light with the same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and forming a conductive connection part on the pixel defining layer, the conductive connection part electrically connects to the first electrode in the abnormal pixel unit through the first through hole, and to the first electrode in the candidate pixel unit through the second through hole.

Optionally, the step of cutting off electrical connection between the pixel driving circuit and the first electrode in an abnormal pixel unit specifically comprises:

cutting off the electrical connection between the pixel driving circuit and the first electrode in the abnormal pixel unit by using a laser.

Optionally, the step of forming a first through hole and a second through hole in the pixel defining layer specifically comprises:

forming, in the pixel defining layer, the first through hole communicating the top surface of the pixel defining layer and the top surface of the first electrode in the abnormal pixel unit by using a laser, the first through hole being not communicated to the opening in the abnormal pixel unit; and forming, in the pixel defining layer, the second through hole communicating the top surface of the pixel defining layer and the top surface of the first electrode in the candidate pixel unit by using a laser, the second through hole being not communicated to the opening in the candidate pixel unit.

Optionally, the step of forming the conductive connection part on the pixel defining layer specifically comprises:

depositing, by using a chemical vapor deposition method, conductive material in the first through hole, the second through hole and a blank region on the pixel defining layer between the first through hole and the second through hole, so as to form a pattern of the conductive connection part.

Optionally, the conductive connection part is made of tungsten.

Optionally, the pixel defining layer is made of acrylic material.

To realize the above object, the present invention further provides a repairing device for an array substrate, the array substrate comprises a plurality of pixel units, wherein each pixel unit is provided therein with a pixel driving circuit and a first electrode, a pixel defining layer is formed above the pixel driving circuit and the first electrode, and the pixel defining layer is provided with an opening communicating to the first electrode, wherein the repairing device comprises:

a circuit cutting off unit, which is configured for cutting off electrical connection between the pixel driving circuit and the first electrode in an abnormal pixel unit so as to disconnect the pixel driving circuit from the first electrode;

a through hole forming unit, which is configured for selecting, as a candidate pixel unit, a normal pixel unit adjacent to the abnormal pixel unit and emits light with the same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and a connection part forming unit, which is configured for forming a conductive connection part on the pixel defining layer, the conductive connection part electrically connects to the first electrode in the abnormal pixel unit through the first through hole, and to the first electrode in the candidate pixel unit through the second through hole.

Optionally, both the circuit cutting off unit and the through hole forming unit are laser cutting machines.

Optionally, the connection part forming unit is a chemical vapor deposition repairing machine.

To realize the above object, the present invention further provides a manufacturing method of an array substrate, comprising:

sequentially forming a pixel driving circuit, an insulation layer and a first electrode on a base substrate, the insulation layer being formed with a through hole, and the first electrode being electrically connected to the pixel driving circuit through the through hole;

forming a pixel defining layer above the first electrode and the insulation layer, the pixel defining layer being provided therein with an opening communicating to the first electrode;

repairing an abnormal pixel unit on the array substrate by using the above repairing method of the array substrate;

forming an electroluminescent layer in the opening; and forming a second electrode above the electroluminescent layer.

To realize the above object, the present invention further provides a manufacturing method of an array substrate, comprising:

sequentially forming a pixel driving circuit, an insulation layer and a first electrode on a base substrate, the insulation layer being formed with a through hole, and the first electrode being electrically connected to the pixel driving circuit through the through hole;

forming a pixel defining layer above the first electrode and the insulation layer, the pixel defining layer being provided therein with an opening communicating to the first electrode;

forming an electroluminescent layer in the opening;

forming a second electrode above the electroluminescent layer; and repairing an abnormal pixel unit on the array substrate by using the above repairing method of the array substrate.

The present invention has the following advantages:

The present invention provides a repairing method, a repairing device and a manufacturing method of an array substrate, the repairing method of an array substrate comprises: cutting off electrical connection between the pixel driving circuit and the first electrode in an abnormal pixel unit so as to disconnect the pixel driving circuit and the first electrode; selecting, as a candidate pixel unit, a normal pixel unit adjacent to the abnormal pixel unit and emits light with the same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; forming a conductive connection part on the pixel defining layer, the conductive connection part electrically connects to the first electrode in the abnormal pixel unit through the first through hole, and to the first electrode in the candidate pixel unit through the second through hole. In the solutions in the present invention, the pixel driving circuit in the candidate pixel unit is electrically connected to the OLED in the abnormal pixel unit, so that repair of the abnormal pixel unit can be realized. Meanwhile, since connection between the pixel driving circuit and the first electrode in the abnormal pixel unit is cut off, signals in the pixel driving circuit in the abnormal pixel unit can be effectively prevented from affecting the OLED in the abnormal pixel unit.

DETAILED DESCRIPTION OF THE EMBODIMENTS

To make persons skilled in the art better understand the solutions in the present invention, a repairing method, a repairing device and a manufacturing method of an array substrate will be described in detail below in conjunction with the accompanying drawings.

First Embodiment

Figure 1:
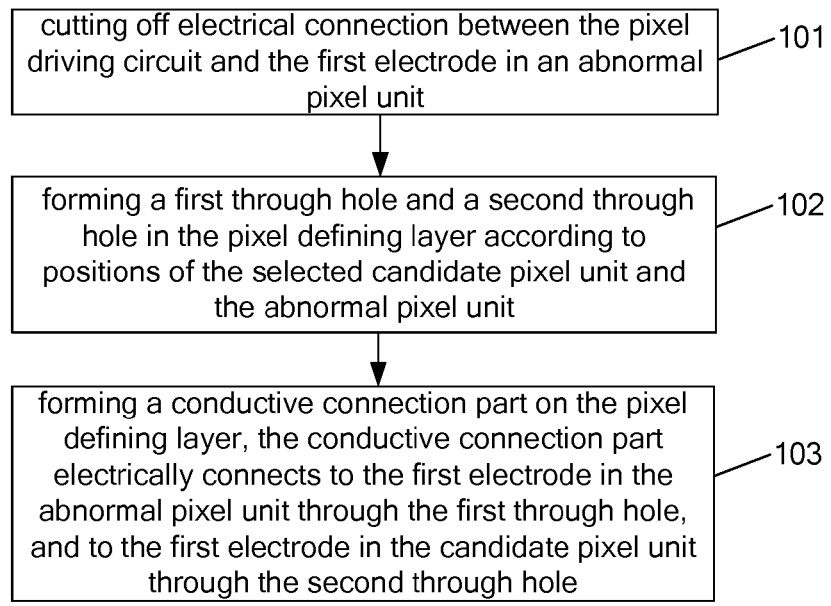
FIG. 1 is a flowchart of a repairing method of an array substrate provided by a first embodiment of the present invention.
Figure 2:
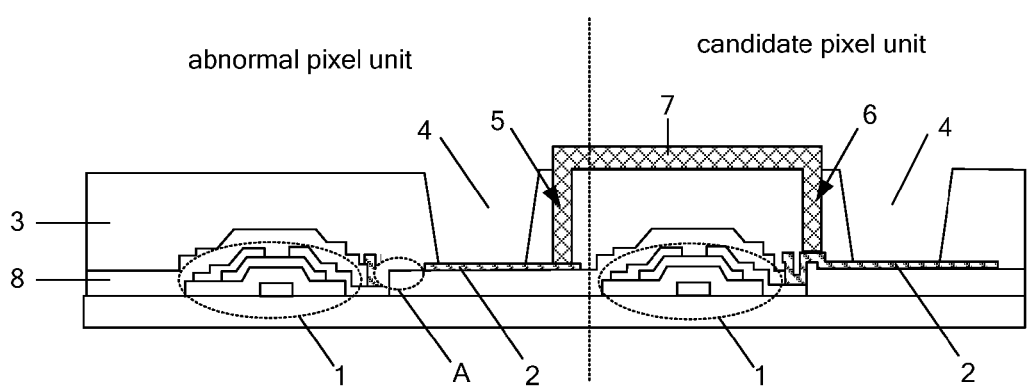
FIG. 2 is a schematic diagram illustrating a principle of repairing the abnormal pixel unit in the present invention.

FIG. 1 is a flowchart of a repairing method of an array substrate provided by a first embodiment of the present invention, FIG. 2 is a schematic diagram illustrating a principle of repairing the abnormal pixel unit in the present invention, as shown in FIG. 1 and FIG. 2, the array substrate comprises: a plurality of pixel units, wherein each pixel unit is provided therein with a pixel driving circuit 1 (FIG. 2 only schematically shows one driving transistor in the pixel driving circuit) and a first electrode 2, a pixel defining layer 3 is formed above the pixel driving circuit 1 and the first electrode 2, and the pixel defining layer 3 is provided with an opening 4 communicating to the first electrode 2, the repairing method comprises:

Step 101, cutting off electrical connection between the pixel driving circuit 1 and the first electrode 2 in an abnormal pixel unit so as to disconnect the pixel driving circuit 1 from the first electrode 2.

In the step 101, the pixel driving circuit 1 in the abnormal pixel unit can be prevented from outputting abnormal current to the first electrode 2 by cutting off the electrical connection between the pixel driving circuit 1 and the first electrode 2 in the abnormal pixel unit.

It should be noted that, the first electrode 2 in the present embodiment specifically refers to an anode of an OLED, and size of the anode is larger than that of a cross section at bottom of the opening 4, as shown in FIG. 2.

In the present embodiment, the electrical connection between the pixel driving circuit 1 and the first electrode 2 in the abnormal pixel unit may be cut off by using a laser cutting technique. Specifically, the electrical connection between the pixel driving circuit 1 and the first electrode 2 in the abnormal pixel unit may be cut off through adjusting a focal point of a laser emitted from a laser cutting machine to a joint (e.g., area A in FIG. 2) of the pixel driving circuit 1 and the first electrode 2 in the abnormal pixel unit.

However, the above step 101 only disenables the abnormal pixel unit to emit light, but cannot repair the abnormal pixel unit.

To solve the above problem, in the present invention, a candidate pixel unit is selected on the array substrate, and the candidate pixel unit is used to repair the abnormal pixel unit. Specifically, during the array substrate displays an image, two pixel units, which are adjacent to each other and emit light with a same color, on the array substrate have approximate grey scale values, that is, OLEDs in the two pixel units receive approximate same driving currents, therefore, in the present invention, a normal pixel unit, which is adjacent to the abnormal pixel unit and emits light with the same color as the abnormal pixel unit, is selected as the candidate pixel unit, and the pixel driving circuit 1 in the selected candidate pixel unit is used to supply a driving current to the OLED in the abnormal pixel unit, thus the abnormal pixel unit is repaired.

Figure 3:
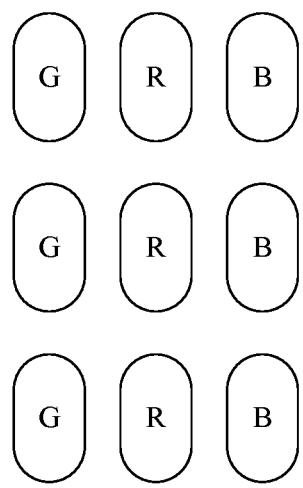
FIG. 3 is a schematic diagram illustrating an arrangement of pixels on an array substrate.

FIG. 3 is a schematic diagram illustrating an arrangement of pixels on an array substrate, as shown in FIG. 3, the array substrate (only three rows and three columns of pixel units are exemplarily shown in the drawing) includes pixel units of three different colors, that is, red pixel units R, green pixel units G and blue pixel units B, and the pixel units in the same column on the array substrate correspond to identical colors, wherein assuming that a red pixel unit R in the second row and the second column is detected as an abnormal pixel unit, at this time, a red pixel unit R in the first row and the second column or a red pixel unit R in the third row and the second column may be selected as the candidate pixel unit.

Figure 4:
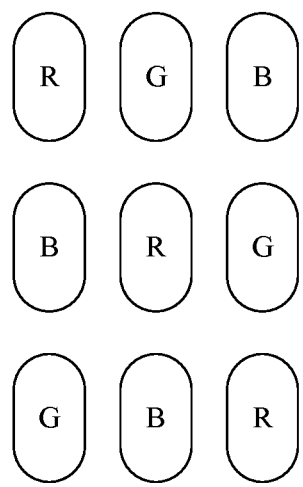
FIG. 4 is a schematic diagram illustrating another arrangement of pixels on an array substrate.

FIG. 4 is a schematic diagram illustrating another arrangement of pixels on an array substrate, as shown in FIG. 4, the array substrate (only three rows and three columns of pixel units are exemplarily shown in the drawing) includes pixel units of three different colors, that is, red pixel units R, green pixel units G and blue pixel units B, and the pixel units of the same color on the array substrate are arranged in a stagger manner, wherein assuming that a red pixel unit R in the second row and the second column is detected as an abnormal pixel unit, at this time, a red pixel unit R in the first row and the first column or a red pixel unit R in the third row and the third column may be selected as the candidate pixel unit.

It should be noted that, the above arrangement of pixel units shown in FIG. 3 and FIG. 4 are only exemplary, but not to limit the solutions of the present application, the solutions of the present invention may also be applicable to array substrates adopting other arrangement of pixel units.

To enable the driving current generated by the pixel driving circuit 1 in the candidate pixel unit to be output to the OLED in the abnormal pixel unit, it is required to electrically connect the pixel driving circuit 1 in the candidate pixel unit to the first electrode 2 in the abnormal pixel unit. Specific procedure may refer to the following steps 102 and 103.

Step 102, forming a first through hole and a second through hole in the pixel defining layer according to positions of the selected candidate pixel unit and the abnormal pixel unit, so that the first through hole communicates a top surface of the pixel defining layer and a top surface of the first electrode in the abnormal pixel unit, and the second through hole communicates the top surface of the pixel defining layer and the top surface of the first electrode in the candidate pixel unit.

Optionally, the pixel defining layer 3 is made of acrylic material, the first through hole 5 communicating the top surface of the pixel defining layer 3 and the top surface of the first electrode 2 in the abnormal pixel unit may be formed in the pixel defining layer 3 by using a laser cutting technique, and the first through hole 5 is not communicated to the opening 4 in the abnormal pixel unit. The second through hole 6 communicating the top surface of the pixel defining layer 3 and the top surface of the first electrode 2 in the candidate pixel unit may be formed in the pixel defining layer 3 by using a laser cutting technique, and the second through hole 6 is not communicated to the opening 4 in the candidate pixel unit.

It should be noted that, since it is required to ensure that the first through hole 5 is not communicated to a corresponding opening 4 in the abnormal pixel unit, and the second through hole 6 is not communicated to a corresponding opening 4 in the candidate pixel unit, accuracy of positions at which the first through hole 5 and the second through hole 6 are to be formed must be high, the laser cutting technique used in the present invention can accurately control the positions for forming the first through hole 5 and the second through hole 6, therefore, the technical means of forming the first through hole 5 and the second through hole 6 in the pixel defining layer 3 using the laser cutting technique is a preferable solution in the present invention. Certainly, the pixel defining layer 3 in the present invention may be made of other material, and the first through hole 5 and the second through hole 6 may be formed by using other technical means, which will not be described one by one herein.

Step 103, forming a conductive connection part 7 on the pixel defining layer, the conductive connection part 7 electrically connects to the first electrode 2 in the abnormal pixel unit through the first through hole 5, and to the first electrode 2 in the candidate pixel unit through the second through hole 6.

In the step 103, optionally, a chemical vapor deposition repairing machine is used to deposit conductive material in the first through hole 5, the second through hole 6 and a blank region on the pixel defining layer 3 between the first through hole 5 and the second through hole 6, so as to form a pattern of the conductive connection part 7. Specifically, a nozzle of the chemical vapor deposition repairing machine is aimed at the first through hole 5 and the conductive material is deposited in the first through hole 5. Then the nozzle of the chemical vapor deposition repairing machine is slowly moved to the second through hole 6 from the first through hole 5, simultaneously, the conductive material is deposited on the blank region on the pixel defining layer 3 between the first through hole 5 and the second through hole 6. Finally, the conductive material is deposited in the second through hole 6. At this time, the pixel driving circuit 1 in the candidate pixel unit may be electrically connected to the first electrode 2 in the abnormal pixel unit through the conductive connection part 7.

It should be noted that, since the first through hole 5 is not communicated to the opening 4 in the abnormal pixel unit, and the second through hole 6 is not communicated to the opening 4 in the candidate pixel unit, the formation of the conductive connection part 7 will not affect the structures (for example, the electroluminescent layers) in the openings 4 of the abnormal pixel unit and the candidate pixel unit.

Optionally, the conductive connection part 7 is made of tungsten.

It should be noted that, the chemical vapor deposition repairing machine is a common machine in the art, operation principle thereof will not be repeated herein.

With the above steps 102 and 103, the pixel driving circuit 1 in the candidate pixel unit may be electrically connected to the OLED in the abnormal pixel unit, so that the OLED in the abnormal pixel unit is driven by the pixel driving circuit 1 in the candidate pixel unit, therefore the abnormal pixel unit is repaired. In addition, since the connection between the pixel driving circuit 1 and the first electrode 2 in the abnormal pixel unit is cut off in the step 101, thus signals in the pixel driving circuit 1 in the abnormal pixel unit can be effectively prevented from affecting the OLED in the abnormal pixel unit It should be noted that, in the present embodiment, the steps 102 and 103 may also be performed first, and then the step 101 is performed, which will not be described in detail herein.

Second Embodiment

The second embodiment of the present invention provides a repairing device for an array substrate, the array substrate comprises a plurality of pixel units, wherein each pixel unit is provided therein with a pixel driving circuit and a first electrode, a pixel defining layer is formed above the pixel driving circuit and the first electrode, and the pixel defining layer is provided with an opening communicating to the first electrode, the repairing device is configured to perform the repairing method provided in the above first embodiment.

Figure 5:
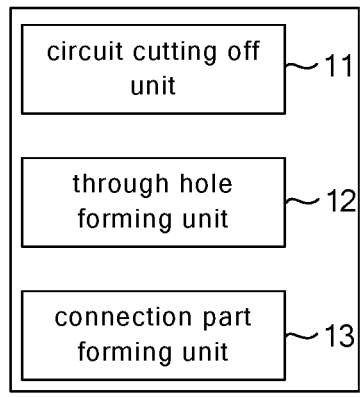
FIG. 5 is a structural diagram of a repairing device for an array substrate provided by a second embodiment of the present invention.

FIG. 5 is a structural diagram of a repairing device for an array substrate provided by a second embodiment of the present invention, as shown in FIG. 5, this repairing device comprises a circuit cutting off unit 11, a through hole forming unit 12 and a connection part forming unit 13, wherein the circuit cutting off unit 11 is configured for cutting off electrical connection between the pixel driving circuit and the first electrode in an abnormal pixel unit so as to disconnect the pixel driving circuit from the first electrode; the through hole forming unit 12 is configured for selecting, as a candidate pixel unit, a normal pixel unit adjacent to the abnormal pixel unit and emits light with the same color as the abnormal pixel unit, and forming a first through hole and a second through hole at corresponding positions in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and the connection part forming unit 13 is configured for forming a conductive connection part on the pixel defining layer, the conductive connection part electrically connects to the first electrode in the abnormal pixel unit through the first through hole, and to the first electrode in the candidate pixel unit through the second through hole.

Optionally, both the circuit cutting off unit 11 and the through hole forming unit 12 are laser cutting machines.

During cutting or boring by the laser cutting machine, the process accuracy can be ensured by controlling the focal point of the emitted laser. More importantly, since the circuit cutting off unit 11 and the through hole forming unit 12 adopt a same laser cutting machine, structure complexity and cost of the repairing device can be effectively reduced.

Optionally, the conductive connection part forming unit is a chemical vapor deposition repairing machine. Since the number of the abnormal pixel units to be repaired on the array substrate is small, if the conductive connection part is formed by using a mask process, a large waste of materials may be caused. In contrast, the pattern for forming the conductive connection part is directly drawn by using the chemical vapor deposition repairing machine in the present invention, which can effectively prevent material waste.

Third Embodiment

Figure 6:
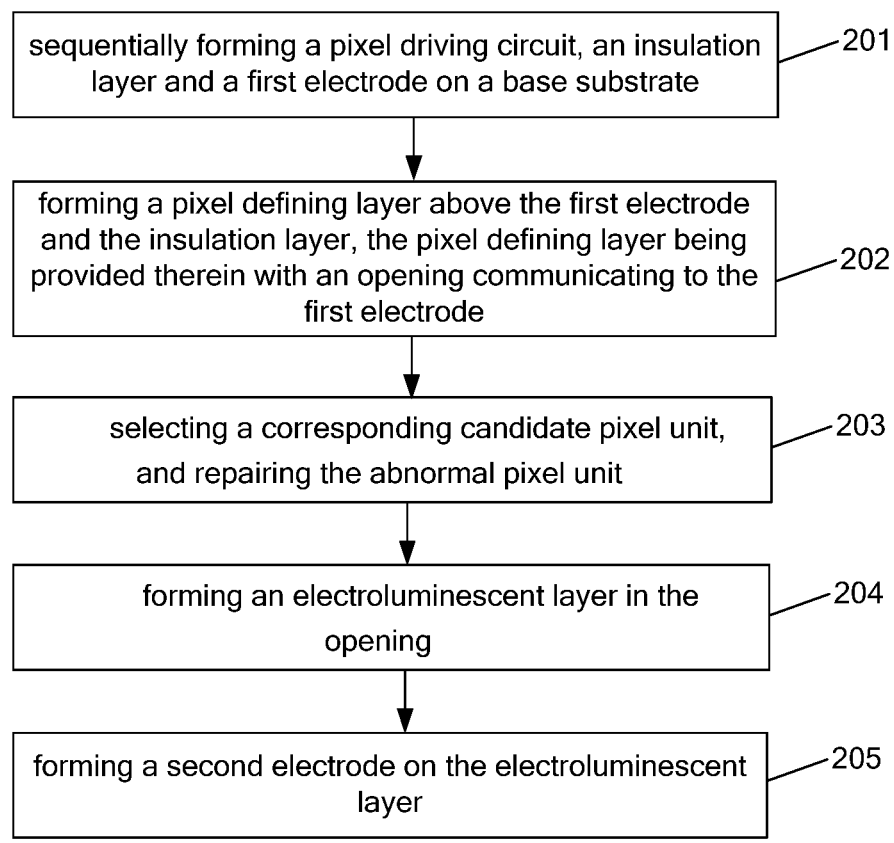
FIG. 6 is a flowchart of a manufacturing method of an array substrate provided by a third embodiment of the present invention.

FIG. 6 is a flowchart of a manufacturing method of an array substrate provided by a third embodiment of the present invention, as shown in FIG. 6, the manufacturing method comprises steps 201 to 205.

Step 201, sequentially forming a pixel driving circuit, an insulation layer and a first electrode on a base substrate, the insulation layer is formed with a through hole, and the first electrode is electrically connected to the pixel driving circuit through the through hole.

Step 202, forming a pixel defining layer above the first electrode and the insulation layer, the pixel defining layer is provided therein with an opening communicating to the first electrode.

With reference to FIG. 2, on the array substrate subjected to the above steps 201 and 202, the insulation layer 8 covers the whole pixel driving circuit 1, the first electrode 2 is electrically connected to the pixel driving circuit 1 through a through hole (not shown), a part of the first electrode 2 is covered by the pixel defining layer 3, and the other part of the first electrode 2 is exposed to the opening 4 formed in the pixel defining layer 3.

After the step 202 is completed, an operator may inspect whether or not the respective pixel driving circuits 1 in the pixel units have defect, so that the abnormal pixel unit on the array substrate can be determined.

Step 203, selecting a corresponding candidate pixel unit according to position of the abnormal pixel unit, and repairing the abnormal pixel unit.

In the step 203, the abnormal pixel unit is repaired by using the repairing method provided in the above first embodiment, and specific procedure thereof may refer to the description in the above first embodiment and will not be repeated herein.

Referring to FIG. 2 again, after the step 203, the electrical connection between the pixel driving circuit 1 and the first electrode 2 in the abnormal pixel unit is cut off, meanwhile, the pixel defining layer 3 is provided therein with a first through hole 5 communicating a top surface of the pixel defining layer 3 and a top surface of the first electrode 2 in the abnormal pixel unit, and a second through hole 6 communicating the top surface of the pixel defining layer and a top surface of the first electrode 2 in the candidate pixel unit, the pixel defining layer 3 is also provided with a conductive connection part 7 electrically connecting to the first electrode 2 in the abnormal pixel unit through the first through hole 5, and to the first electrode 2 in the candidate pixel unit through the second through hole 6. The pixel driving circuit 1 in the candidate pixel unit is electrically connected to the first electrode 2 in the abnormal pixel unit through the conductive connection part 7, therefore the abnormal pixel unit is repaired.

Step 204, forming an organic electroluminescent layer in the opening.

Step 205, forming a second electrode on the electroluminescent layer.

It should be noted that, the second electrode is a cathode electrode of an OLED. The first electrode 2, the organic electroluminescent layer (not shown in FIG. 2) and the second electrode (not shown in FIG. 2) form the OLED.

Fourth Embodiment

Figure 7:
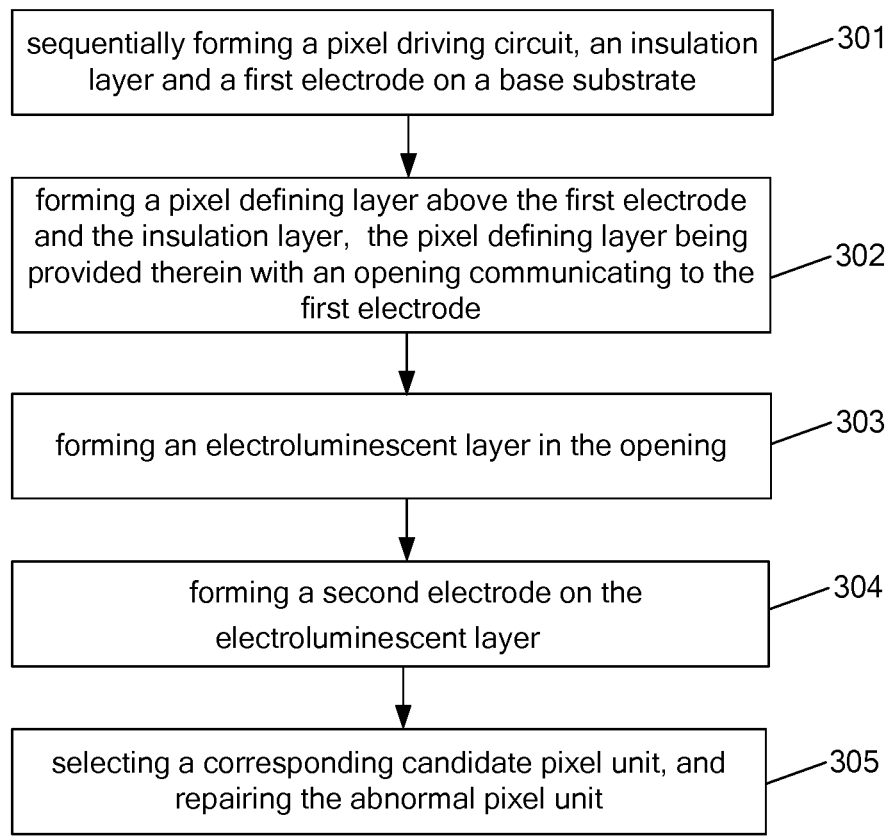
FIG. 7 is a flowchart of a manufacturing method of an array substrate provided by a fourth embodiment of the present invention.

FIG. 7 is a flowchart of a manufacturing method of an array substrate provided by a fourth embodiment of the present invention, as shown in FIG. 7, the manufacturing method comprises steps 301 to 305.

Step 301, sequentially forming a pixel driving circuit, an insulation layer and a first electrode on a base substrate, the insulation layer is formed with a through hole, and the first electrode is electrically connected to the pixel driving circuit through the through hole.

Step 302, forming a pixel defining layer above the first electrode and the insulation layer, the pixel defining layer is provided therein with an opening communicating to the first electrode.

Step 303, forming an organic electroluminescent layer in the opening.

Step 304, forming a second electrode on the electroluminescent layer.

After the step 304 is completed, whether or not the respective pixel driving circuits 1 in the pixel units have defect may be inspected by an operator or tested by lighting, to determine the abnormal pixel unit on the array substrate.

Step 305, selecting a corresponding candidate pixel unit according to position of the abnormal pixel unit, and repairing the abnormal pixel unit.

Figure 8:
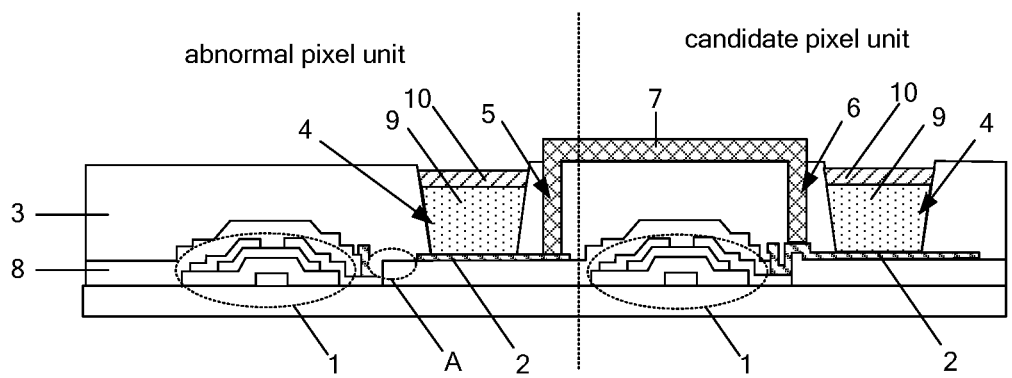
FIG. 8 is a cross sectional diagram of an array substrate subjected to a process in a step 305.

FIG. 8 is a cross sectional diagram of the array substrate subjected to a process in the step 305, as shown in FIG. 8, in the step 305, the abnormal pixel unit is repaired by using the repairing method provided by the above first embodiment, at this time, the joint (e.g., area A in FIG. 8) between the pixel driving circuit 1 (only a driving transistor in the pixel driving circuit is exemplarily shown in FIG. 8) and the first electrode 2 in the abnormal pixel unit is cut off. Meanwhile, the pixel defining layer 3 is provided therein with a first through hole 5 communicating a top surface of the pixel defining layer 3 and a top surface of the first electrode 2 in the abnormal pixel unit, and a second through hole 6 communicating the top surface of the pixel defining layer and a top surface of the first electrode 2 in the candidate pixel unit, the pixel defining layer 3 is also provided with a conductive connection part 7 electrically connecting to the first electrode 2 in the abnormal pixel unit through the first through hole 5, and to the first electrode 2 in the candidate pixel unit through the second through hole 6. The pixel driving circuit 1 in the candidate pixel unit is electrically connected to the first electrode 2 in the abnormal pixel unit through the conductive connection part 7, therefore the abnormal pixel unit is repaired.

It should be noted that, the solution in the fourth embodiment is different from that in the third embodiment in that: the repairing step in the fourth embodiment is performed after the step of forming the second electrode 10, but the repairing step in the third embodiment is performed before the step of forming the electroluminescent layer 9. Therefore, when abnormal pixel unit on the array substrate is to be determined, in the fourth embodiment, the abnormal pixel unit not only can be determined by directly inspecting the pixel driving circuit 1, but also can be obtained through testing by lighting, therefore, it is relatively easy to determine the abnormal pixel unit in the fourth embodiment. Then, when the abnormal pixel unit is repaired, especially when the electrical connection between the pixel driving circuit 1 and the first electrode 2 in the abnormal pixel unit is cut off and the first through hole 5 and the second through hole 6 are formed by using a laser cutting machine, in the fourth embodiment, laser generated by the laser cutting machine is extremely easy to irradiate onto the electroluminescent layer 9, and thus affecting the performance of the electroluminescent layer 9. However, in the above third embodiment, since when the abnormal pixel unit is repaired, the electroluminescent layer 9 is still not formed, it is unnecessary to worry about the affection of the laser on the electroluminescent layer 9, and the operational space is larger.

In the above embodiments in the present invention, the pixel driving circuit in the candidate pixel unit is electrically connected to the OLED in the abnormal pixel unit, so that the abnormal pixel unit can be repaired. Meanwhile, since connection between the pixel driving circuit and the first electrode in the abnormal pixel unit is cut off, signals in the pixel driving circuit in the abnormal pixel unit can be effectively prevented from affecting the OLED in the abnormal pixel unit.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

The invention claimed is:

1. A repairing method of an array substrate, the array substrate comprises a plurality of pixel units, wherein each pixel unit is provided therein with a pixel driving circuit and a first electrode, a pixel defining layer is formed above the pixel driving circuit and the first electrode, the pixel defining layer is provided with an opening communicating to the first electrode, an electroluminescent layer is provided in the opening, and the first electrode is configured to drive the electroluminescent layer to emit light, wherein the repairing method comprises:
    cutting off electrical connection between the pixel driving circuit and the first electrode in an abnormal pixel unit so as to disconnect the pixel driving circuit from the first electrode;
    selecting, as a candidate pixel unit, a normal pixel unit adjacent to the abnormal pixel unit and emits light with the same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and
    forming a conductive connection part on the pixel defining layer, the conductive connection part electrically connects to the first electrode in the abnormal pixel unit through the first through hole, and to the first electrode in the candidate pixel unit through the second through hole, wherein the conductive connection part is formed by depositing, by using a chemical vapor deposition method, conductive material in the first through hole, the second through hole, and a blank region on the pixel defining layer between the first through hole and the second through hole.

2. The repairing method of an array substrate of claim 1, wherein the step of cutting off electrical connection between the pixel driving circuit and the first electrode in an abnormal pixel unit specifically comprises:
cutting off the electrical connection between the pixel driving circuit and the first electrode in the abnormal pixel unit by using a laser.

3. The repairing method of an array substrate of claim 1, wherein the step of forming a first through hole and a second through hole in the pixel defining layer specifically comprises:
forming, in the pixel defining layer, the first through hole communicating the top surface of the pixel defining layer and the top surface of the first electrode in the abnormal pixel unit by using a laser, the first through hole being not communicated to the opening in the abnormal pixel unit; and
forming, in the pixel defining layer, the second through hole communicating the top surface of the pixel defining layer and the top surface of the first electrode in the candidate pixel unit by using a laser, the second through hole being not communicated to the opening in the candidate pixel unit.

4. The repairing method of an array substrate of claim 1, wherein the step of forming the conductive connection part on the pixel defining layer
forms a pattern of the conductive connection part.

5. The repairing method of an array substrate of claim 1, wherein the conductive connection part is made of tungsten.

6. The repairing method of an array substrate of claim 1, wherein the pixel defining layer is made of acrylic material.

7. A repairing device for an array substrate, the array substrate comprises a plurality of pixel units, wherein each pixel unit is provided therein with a pixel driving circuit and a first electrode, a pixel defining layer is formed above the pixel driving circuit and the first electrode, the pixel defining layer is provided with an opening communicating to the first electrode, an electroluminescent layer is provided in the opening, and the first electrode is configured to drive the electroluminescent layer to emit light, wherein
the repairing device comprises:
a circuit cutting off unit, which is configured for cutting off electrical connection between the pixel driving circuit and the first electrode in an abnormal pixel unit so as to disconnect the pixel driving circuit from the first electrode;
a through hole forming unit, which is configured for selecting, as a candidate pixel unit, a normal pixel unit adjacent to the abnormal pixel unit and emits light with the same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and a connection part forming unit, which is configured for forming a conductive connection part on the pixel defining layer, the conductive connection part electrically connects to the first electrode in the abnormal pixel unit through the first through hole, and to the first electrode in the candidate pixel unit through the second through hole, wherein the conductive connection part is formed by depositing, by using a chemical vapor deposition method, conductive material in the first through hole, the second through hole, and a blank region on the pixel defining layer between the first through hole and the second through hole.

8. The repairing device of an array substrate of claim 7, wherein both the circuit cutting off unit and the through hole forming unit are laser cutting machines.

9. The repairing device of an array substrate of claim 7, wherein the connection part forming unit is a chemical vapor deposition repairing machine.

10. A manufacturing method of an array substrate, comprising:
sequentially forming a pixel driving circuit, an insulation layer and a first electrode on a base substrate, the insulation layer being formed with a through hole, and the first electrode being electrically connected to the pixel driving circuit through the through hole;
forming a pixel defining layer above the first electrode and the insulation layer, the pixel defining layer being provided therein with an opening communicating to the first electrode; and
repairing an abnormal pixel unit on the array substrate by using a repairing method of the array substrate, then forming an electroluminescent layer in the opening; and
forming a second electrode above the electroluminescent layer;
wherein the array substrate comprises a plurality of pixel units, wherein each pixel unit is provided therein with the pixel driving circuit and the first electrode, and the pixel defining layer is formed above the pixel driving circuit and the first electrode,
wherein the repairing method comprises:
cutting off electrical connection between the pixel driving circuit and the first electrode in the abnormal pixel unit so as to disconnect the pixel driving circuit from the first electrode;
selecting, as a candidate pixel unit, a normal pixel unit adjacent to the abnormal pixel unit and emits light with a same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and
forming a conductive connection part on the pixel defining layer, the conductive connection part electrically connects to the first electrode in the abnormal pixel unit through the first through hole, and to the first electrode in the candidate pixel unit through the second through hole.

11. The manufacturing method of an array substrate of claim 10, wherein the step of cutting off electrical connection between the pixel driving circuit and the first electrode in an abnormal pixel unit specifically comprises:

cutting off the electrical connection between the pixel driving circuit and the first electrode in the abnormal pixel unit by using a laser.

12. The manufacturing method of an array substrate of claim 10, wherein the step of forming a first through hole and a second through hole in the pixel defining layer specifically comprises:

forming, in the pixel defining layer, the first through hole communicating the top surface of the pixel defining layer and the top surface of the first electrode in the abnormal pixel unit by using a laser, the first through hole being not communicated to the opening in the abnormal pixel unit; and forming, in the pixel defining layer, the second through hole communicating the top surface of the pixel defining layer and the top surface of the first electrode in the candidate pixel unit by using a laser, the second through hole being not communicated to the opening in the candidate pixel unit.

13. The manufacturing method of an array substrate of claim 10, wherein the step of forming the conductive connection part on the pixel defining layer specifically comprises:

depositing, by using a chemical vapor deposition method, conductive material in the first through hole, the second through hole and a blank region on the pixel defining layer between the first through hole and the second through hole, so as to form a pattern of the conductive connection part.

14. The manufacturing method of an array substrate of claim 10, wherein the conductive connection part is made of tungsten.

15. The manufacturing method of an array substrate of claim 10, wherein the pixel defining layer is made of acrylic material.

16. A manufacturing method of an array substrate, comprising:

sequentially forming a pixel driving circuit, an insulation layer and a first electrode on a base substrate, the insulation layer being formed with a through hole, and the first electrode being electrically connected to the pixel driving circuit through the through hole;

forming a pixel defining layer above the first electrode and the insulation layer, the pixel defining layer being provided therein with an opening communicating to the first electrode;

forming an electroluminescent layer in the opening; and forming a second electrode above the electroluminescent layer, then repairing an abnormal pixel unit on the array substrate by using a repairing method of the array substrate;

wherein the array substrate comprises a plurality of pixel units, wherein each pixel unit is provided therein with the pixel driving circuit and the first electrode, and the pixel defining layer is formed above the pixel driving circuit and the first electrode, wherein the repairing method comprises:

cutting off electrical connection between the pixel driving circuit and the first electrode in the abnormal pixel unit so as to disconnect the pixel driving circuit from the first electrode;

selecting, as a candidate pixel unit, a normal pixel unit adjacent to the abnormal pixel unit and emits light with a same color as the abnormal pixel unit, and forming a first through hole and a second through hole in the pixel defining layer according to positions of the selected candidate pixel unit and the abnormal pixel unit, wherein the first through hole communicates a top surface of the pixel defining layer and a top surface of the first electrode in the abnormal pixel unit, and the second through hole communicates the top surface of the pixel defining layer and the top surface of the first electrode in the candidate pixel unit; and forming a conductive connection part on the pixel defining layer, the conductive connection part electrically connects to the first electrode in the abnormal pixel unit through the first through hole, and to the first electrode in the candidate pixel unit through the second through hole.

17. The manufacturing method of an array substrate of claim 16, wherein the step of cutting off electrical connection between the pixel driving circuit and the first electrode in an abnormal pixel unit specifically comprises:

cutting off the electrical connection between the pixel driving circuit and the first electrode in the abnormal pixel unit by using a laser.

18. The manufacturing method of an array substrate of claim 16, wherein the step of forming a first through hole and a second through hole in the pixel defining layer specifically comprises:

forming, in the pixel defining layer, the first through hole communicating the top surface of the pixel defining layer and the top surface of the first electrode in the abnormal pixel unit by using a laser, the first through hole being not communicated to the opening in the abnormal pixel unit; and forming, in the pixel defining layer, the second through hole communicating the top surface of the pixel defining layer and the top surface of the first electrode in the candidate pixel unit by using a laser, the second through hole being not communicated to the opening in the candidate pixel unit.

19. The manufacturing method of an array substrate of claim 16, wherein the step of forming the conductive connection part on the pixel defining layer specifically comprises:

depositing, by using a chemical vapor deposition method, conductive material in the first through hole, the second through hole and a blank region on the pixel defining layer between the first through hole and the second through hole, so as to form a pattern of the conductive connection part.

20. The manufacturing method of an array substrate of claim 16, wherein the pixel defining layer is made of acrylic material and the conductive connection part is made of tungsten.

* * * * *